(12) United States Patent
Coersmeier

(10) Patent No.: US 7,620,124 B2
(45) Date of Patent: Nov. 17, 2009

(54) DIRECT CONVERSION RECEIVER AND RECEIVING METHOD

(75) Inventor: Edmund Coersmeier, Bochum (DE)

(73) Assignee: Nokia Corporation, Espoo (FI)

( * ) Notice: Subject to any disclaimer, the term of this patent is extended or adjusted under 35 U.S.C. 154(b) by 703 days.

(21) Appl. No.: 11/076,329

(22) Filed: Mar. 10, 2005

(65) Prior Publication Data

US 2005/0152476 A1 Jul. 14, 2005

Related U.S. Application Data

(63) Continuation of application No. PCT/FI02/00737, filed on Sep. 16, 2002.

(51) Int. Cl.
  *H04L 27/20* (2006.01)
(52) U.S. Cl. .................. 375/322; 375/316; 375/346; 375/348; 375/350
(58) Field of Classification Search .............. 375/322, 375/316, 346, 348, 350
  See application file for complete search history.

(56) References Cited

U.S. PATENT DOCUMENTS

| | | | |
|---|---|---|---|
| 4,893,176 A * | 1/1990 | Faroudja ................. | 348/610 |
| 5,999,802 A | 12/1999 | Aschwanden | |
| 6,044,112 A * | 3/2000 | Koslov .................... | 375/235 |
| 6,304,751 B1 | 10/2001 | King | |
| 6,330,290 B1 | 12/2001 | Glas | |
| 6,421,377 B1 * | 7/2002 | Langberg et al. ........ | 375/222 |
| 6,445,731 B1 * | 9/2002 | Yamano et al. ........ | 375/222 |
| 6,631,256 B2 * | 10/2003 | Suominen .............. | 455/302 |
| 6,751,325 B1 * | 6/2004 | Fischer ................... | 381/313 |
| 6,765,623 B1 * | 7/2004 | Parker .................... | 348/607 |
| 7,020,226 B1 * | 3/2006 | Kirkland ................ | 375/355 |
| 7,317,113 B2 * | 1/2008 | Bombardelli et al. ... | 549/297 |
| 2002/0077751 A1 * | 6/2002 | Mieno et al. ........... | 701/213 |
| 2003/0081804 A1 * | 5/2003 | Kates ..................... | 381/316 |
| 2003/0206603 A1 * | 11/2003 | Husted ................... | 375/324 |
| 2004/0174967 A1 * | 9/2004 | Liang et al. ........... | 379/93.35 |

FOREIGN PATENT DOCUMENTS

| | | |
|---|---|---|
| EP | 1 168 597 A1 | 1/2002 |
| WO | WO 98/32221 | 7/1998 |

OTHER PUBLICATIONS

ANSI/IEEE Std 802.11, 1999 Edition (R2003); "*Part 11: Wireless LAN Medium Access Control (MAC) and Physical Layer (PHY) Specifications*", IEEE-SA Standards Board, Jun. 12, 2003, pp. 1-513.

(Continued)

*Primary Examiner*—Shuwang Liu
*Assistant Examiner*—Siu M Lee
(74) *Attorney, Agent, or Firm*—Squire, Sanders & Dempsey, LLP

(57) ABSTRACT

A receiving method and a direct conversion receiver are provided. The receiver comprises a mixer (308) for mixing a received signal into a base band signal comprising I and Q branches, and an A/D converter (316) for converting the base band signal into digital form, and a phase adjuster (318) for performing a frequency selective IQ phase error estimation and for correcting the digitized signal with frequency selective correction factors based on the error estimation.

6 Claims, 6 Drawing Sheets

OTHER PUBLICATIONS

IEEE Std 802.11a-1999 (R2003), "*Part 11: Wireless LAN Medium Access Control (MAC) and Physical Layer (PHY) Specifications*", "*High-Speed Physical Layer in the 5 GHz Band*", IEEE-SA Standards Board, Jun. 12, 2003, pp. 1-83.

IEEE Std 802.11b-1999 (R2003), "*Part 11: Wireless LAN Medium Access Control (MAC) and Physical Layer (PHY) Specifications*", "*Higher-Speed Physical Layer Extension in the 2.4 GHz Band*", IEEE-SA Standards Board, Jun. 12, 2003, pp. 1-89.

\* cited by examiner

DIRECT CONVERSION RECEIVER AND RECEIVING METHOD

This is a Continuation of International Application No. PCT/FI2002/000737 filed Sep. 16, 2002, which designated the U.S. and was published under PCT Article 21(2) in English.

FIELD

The invention relates to a direct conversion receiver and a reception method in direct conversion receivers. The invention relates particularly to removal of IQ phase imbalance in direct conversion receivers.

BACKGROUND

The use of digital wireless communication systems has recently been increasing. Systems of many different types have been introduced. For example, systems like Wireless LANs (Local Area Networks), digital radio DVB-T, UMTS and GSM are gaining more attention and users are given more alternatives in wireless communication. To get customers interested in new services it is essential that the equipment needed in order to use the services should be priced correctly. Receivers with low cost and low power consumption are thus needed.

A solution in affordable receivers with low power consumption is the use of a direct conversion analogue front-end architecture in the receivers. In the direct conversion solution, a received RF signal is directly mixed into the base band and afterwards analogue-to-digital converted. For the mixing process, two signals, a sine and a cosine signal, have to be provided. Because of technical reasons the precise orthogonality of both sinusoidal signals cannot be guaranteed; therefore an angle $\phi \neq 90°$ is measurable between the sine and cosine functions. This phenomenon is commonly called IQ phase imbalance.

Analogue base band components, such as low-pass filters and base-band amplifiers are always installed twice: one component for the I branch and one component for the Q branch. Because of manufacturing tolerances, different age or temperature influences, each component of a certain functional type may behave slightly differently compared with its counterpart on the other branch. Additionally, low-cost analogue low-pass filters may contain amplitude ripple, non-linear phase and they may insert ISI (Inter Symbol Interference). The conjunction of frequency dependent base band devices with the constant IQ phase imbalance imperfections result in frequency selective IQ phase imbalance inaccuracies. FIG. 1A shows as an example the effect of phase error $\phi=10°$ in a 64-QAM single carrier system. Precise IQ constellation points with a shift of 10° are visible. The Q branch values are not affected.

The phase imbalance problem is present in any system employing direct conversion receivers regardless of the modulation scheme or the multipie access solution. Particularly in a multicarrier system, such as WLAN, which uses OFDM, the problem is particularly severe, although it also affects single carrier systems, such as GSM or cable modems. FIG. 1B shows by way of example the effect of phase error $\phi=10°$ in a 64-QAM 64-FFT OFDM system. Compared to FIG. 1A, a shift of 10° is again visible in the IQ constellation diagram, but now both the I and Q branch values are affected by the IQ phase imbalance error.

To provide the required high signal accuracy in receivers it has to be guaranteed that analogue direct conversion front-end imperfections, such as IQ phase imbalance errors, will be minimal. So far, the solutions to the phase imbalance problem have assumed the use of high quality analogue base band components. Thus, the phase imbalance correction methods have not taken frequency dependency into account. However, in low cost consumer appliances the use of high quality components is impossible. Therefore, the current correction methods do not present a solution to phase imbalance correction in low cost receivers.

BRIEF DESCRIPTION OF THE INVENTION

An object of the invention is to provide an improved receiving method and a receiver. According to an aspect of the invention, there is provided a receiving method in a direct conversion receiver, the method comprising: receiving a radio frequency signal; mixing the received radio frequency signal into a base band signal comprising I and Q branches; converting the base band signal into digital form; performing a frequency selective IQ phase error estimation; correcting the digitised signal with frequency selective correction factors based on the error estimation.

According to another aspect of the invention, there is provided a direct conversion receiver in a communication system, comprising: means for mixing a received signal into a base band signal comprising I and Q branches; means for converting the base band signal into digital form; means for performing a frequency selective IQ phase error estimation; means for correcting the digitised signal with frequency selective correction factors based on the error estimation.

Preferred embodiments of the invention are described in the dependent claims.

In a preferred embodiment of the invention, the IQ phase imbalance adjustment is frequency selective. The adjustment procedure is a combination of two consecutive steps, error detection and error correction.

In the first step, frequency selective IQ phase imbalance error detection is performed using a FIR-like (Finite Impulse Response) detector. In the second step, frequency dependent IQ phase correction is performed on the basis of the error detection. The embodiment requires a relatively small amount of computation, is non-decision aided and robust against AWGN (Average White Gaussian Noise). The method works independently of any other receiver algorithm.

The method and receiver of the invention provide several advantages. With the use of the preferred embodiments, it is possible to use low-cost and low-precision analogue filters in combination with a low-precision phaseshifter for the demodulation process in the direct conversion receiver architecture. Thus, the total cost of the receiver can be kept low. Single carrier and OFDM systems in particular can be implemented without any performance reduction by analogue IQ phase imbalance errors.

In an embodiment of the invention, also IQ amplitude imbalance is corrected using a time domain filter with independent adaptive real coefficients. The amplitude imbalance adjustment may be carried out after the phase imbalance correction. The algorithms are independent of each other.

LIST OF DRAWINGS

In the following, the invention will be described in greater detail with reference to the preferred embodiments and the accompanying drawings, in which FIGS. 1A and 1B illustrate effects of an IQ phase imbalance;

DESCRIPTION OF EMBODIMENTS

The embodiments of the invention can be applied in any data transmission system employing direct conversion receivers. Examples of such systems include Wireless LANs (Local Area Networks), digital radio DVB-T, UMTS and GSM. A direct conversion receiver is a receiver where a received radio frequency (RF) signal is converted directly to a base band frequency without any intermediate frequency (IF) conversion in between.

As an example of a system, to which the embodiments of the invention may be applied, let us study a Wireless Local Area Network, WLAN. WLAN is a data transmission medium that uses radio waves in connecting computers to a network. The backbone network is usually wire line and the wireless connection is the last link of the connection between the LAN and users.

Figure 1A:
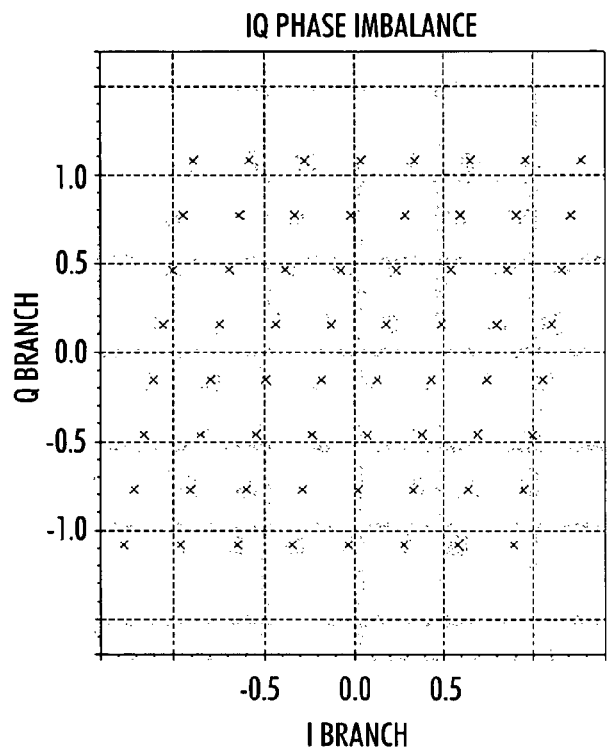
Figure 1B:
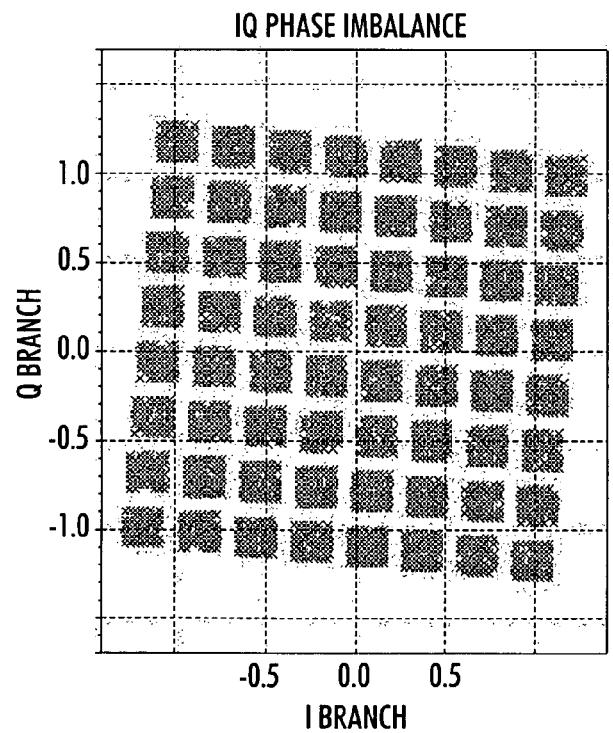
Figure 2:
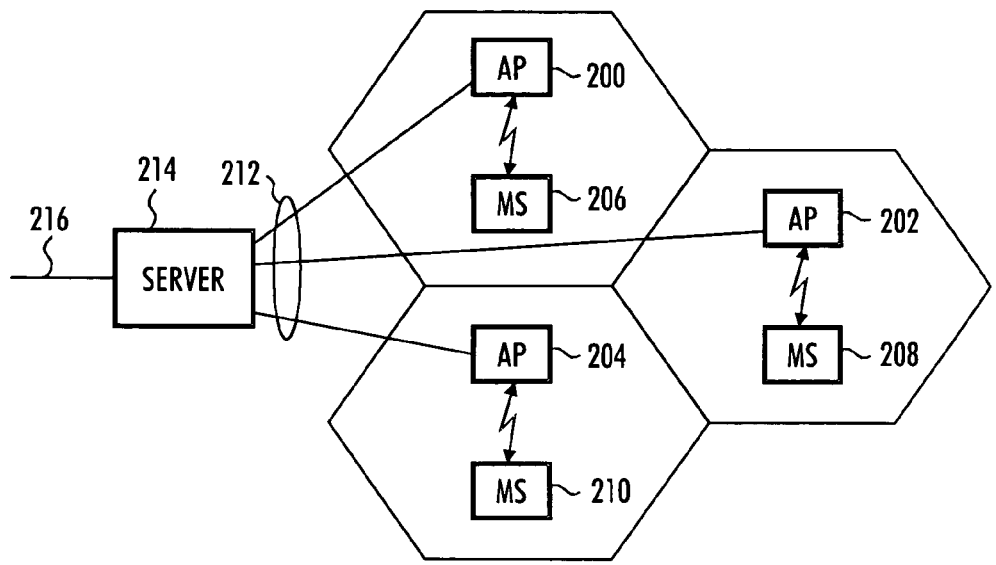
FIG. 2 illustrates an example of a Wireless LAN.

The primary architecture of WLAN resembles a traditional cellular network architecture, for example GSM. With reference to FIG. 2, the system may consist of transceivers called access points (AP) 200 to 204 in the network with certain distances. End users 206 to 210 are connected to access points stations through a radio interface. The access points are connected via a fixed LAN 212 to servers or switches or routers 214 and further to outside networks 216. However, there are also other architectures of WLANs which are not presented here. The Wireless LAN may be constructed according to IEEE (The Institute of Electrical and Electronics Engineers, Inc.) standard 802.11, 802.11a or 802.11b, for example.

Figure 3:
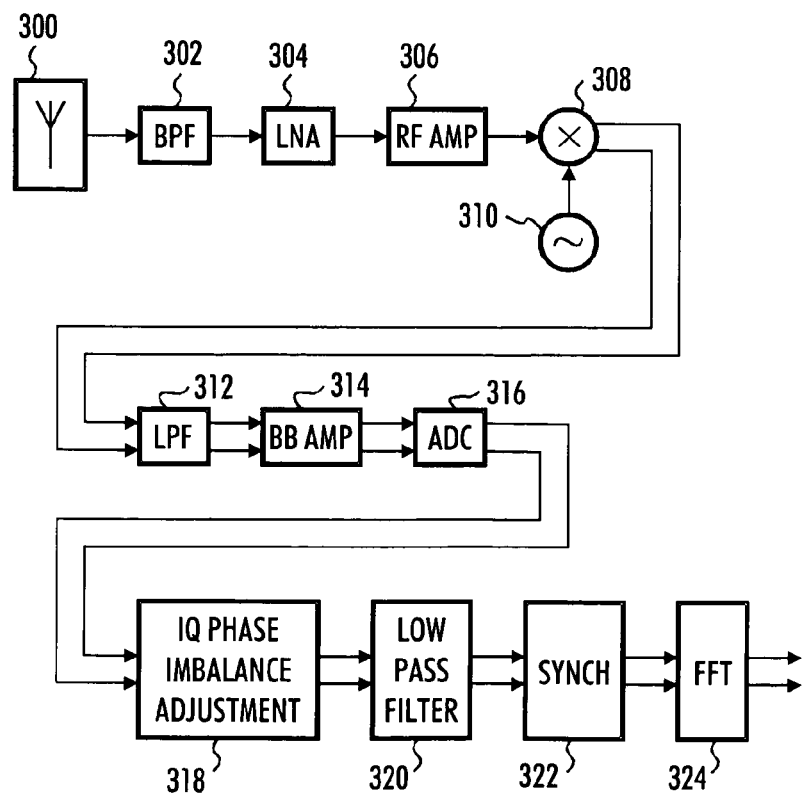
FIG. 3 illustrates an example of a direct conversion receiver according to an embodiment of the invention.

FIG. 3 illustrates an example of a front end for an IEEE802.11a OFDM direct conversion receiver according to an embodiment of the invention. The receiver comprises an antenna 300, whereby a radio frequency signal from a transmitter is received. The received signal is band pass filtered in a filter 302 and amplified in a low noise amplifier 304. Next, the signal is further amplified in an RF-amplifier 306 and directly mixed into the base band frequency in a mixer 308. Local oscillator 310 provides the RF signal used in the mixing. After the mixing process, an analogue complex signal s(t)=I(t)+jQ(t) is available. The signal thus comprises two components, namely I and Q branches 309A, 309B. This mixed signal is passed to an analogue low pass filter 312 and a base band amplifier 314. The signal is then converted into digital form in an A/D converter 316. These receiver components are all known to one skilled in the art.

In multicarrier system in particular such as OFDM systems, IQ phase errors have a significant impact on the signal performance, compared with single carrier radios. It is therefore important to eliminate the IQ phase imbalance in the receiver as early as possible. In the embodiment illustrated by the receiver of FIG. 3, an IQ phase adjustment block 318 follows directly behind the A/D converter 316. After the adjustment block the signal is supplied to a digital low-pass filter 320, a synchronization block 322, being finally converted to frequency domain using FFT (Fast Fourier Transform) in block 324.

Next, the theoretical background of the IQ phase imbalance error will be studied. Let us start with a complex analogue base band signal on the transmitter side:

$$s_{T,B}(t)=I(t)+j \cdot Q(t), \quad (1)$$

where subscripts S and T denote transmitter and base band, respectively. The base band signal is delivered to an analogue up-converter with the carrier frequency $f_c$.

$$s_{T,fc}(t)=Re\{[I(t)+j \cdot Q(t)]e^{-j2\pi f_c t}\}. \quad (2)$$

This real signal can be expressed as $$s_{T,fc}=I(t)+\cos(2\pi f_c t)+Q(t) \cdot \sin(2\pi f_c t). \quad (3)$$

Ideally, the sine and cosine functions are orthogonal but, typically, the physical devices introduce a phase offset φ. This can be described by the transmitter signal $s_{Transmitter,fc,quadrature}(t)$ in equation (4). Here, the phase shift φ is added to the sine wave.

$$s_{T,fc,q}(t)=I(t) \cdot \cos(2\pi f_c t)+Q(t) \cdot \sin(2\pi f_c t+\phi) \quad (4)$$

A receiver down-converter is assumed to provide an exactly 90° phase offset between the sine and cosine functions. Hence, the downconversion in the receiver takes place through $$s_{R,B,q}(t)=[I(t) \cdot \cos(2\pi f_c t)+Q(t) \cdot \sin(2\pi f_c t+\phi)] \cdot e^{+j2\pi f_c t}. \quad (5)$$

After solving the trigonometric product functions, the down converted and low-pass filtered complex base band signal is received as $$s_{R,B,q}(t) = \begin{bmatrix} I(t) \cdot \cos(0) + \dfrac{Q(t)}{2}\sin(\varphi) + \\ j\left(\dfrac{-I(t)}{2}\sin(0) + \dfrac{Q(t)}{2}\cos(\varphi)\right) \end{bmatrix}. \quad (6)$$

Besides omitting the factor ½ the first imaginary term including a sin(0)=0 can be removed, the complex base band signal including the IQ phase imbalance error of angle φ being provided by $$s_{R,B,q}(t)=I(t)+Q(t) \cdot \sin(\phi)+jQ(t) \cdot \cos(\phi). \quad (7)$$

Additionally, IQ amplitude imbalance between the I branch and the Q branch of factor cos(φ) has been discovered. It is now assumed that the IQ amplitude imbalance has already been removed, so it is no longer taken into account. The IQ phase imbalance error insertion can thus be expressed as $$s_{R,B,q}(t)=I(t)+Q(t) \cdot \sin(\phi)+jQ(t). \quad (8)$$

Figure 4:
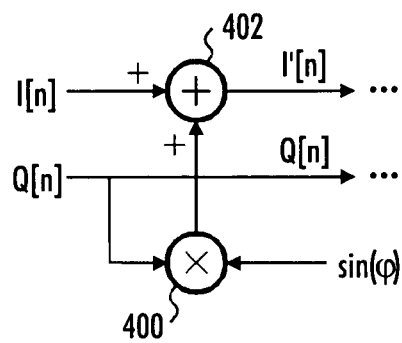
FIG. 4 illustrates IQ phase imbalance error insertion.

Graphically this equation can be illustrated as FIG. 4. The Q branch is delivered without any changes from the transmitter to the receiver. The Q branch is multiplied by the IQ phase imbalance error value sin(φ) in a multiplier 400. This signal is added to the I branch in an adder 402. After summing up the I branch with the generated IQ phase error, the signal is delivered to the receiver. In FIG. 4, I'[n] denotes the I branch signal with the phase error.

Next, let us study non-frequency selective blind IQ phase imbalance adjustment as a background to the preferred embodiments of the invention. First, error detection is performed combined with a low-pass filtering of the calculated error value. The IQ data stream is then accessed to correct the incoming samples. The system may be installed as a feedback loop system. The incoming IQ samples are corrected first. The remaining error is then calculated and low-pass filtered. When the whole IQ phase imbalance error is compensated for, the loop remains in equilibrium. The digital blind error detector will apply the following mathematical considerations. If the I and Q branch samples are statistically independent, the expectation of their product equals zero:

$$E\{I[n] \cdot Q[n]\}=0. \quad (9)$$

In such a case, the adjustment block executes no corrections at all. But if there is an IQ phase imbalance error, inserted equation (9) has to be rewritten on the basis of equation (8):

$$E\{(I[n]+Q[n]\sin(\phi))\cdot Q[n]\} =$$

$$E\{I[n]\cdot Q[n]\} + E\{Q[n]\sin(\phi)\cdot Q[n]\} =$$

$$E\{Q^2[n]\sin(\phi)\} =$$

$$E\{Q^2[n]\}\sin(\phi) = \sigma_Q^2 \cdot \sin(\phi) \approx \sin(\phi) \quad (10)$$

The first addend in the second line of equation (10) equals equation (9) and results in zero. The remaining expectation value will be proportional to the error value $\sin(\phi)$. The expectation of the factor $Q^2[n]$ provides the Q branch with mean power and can be interpreted as an amplification factor, because it always has a positive sign. This result is used to correct the incoming signal stream.

To correct the IQ imbalance error the product of the IQ samples has to be calculated:

$$e[n] = I[n]\cdot Q[n]. \quad (11)$$

The expectation value respectively the correction coefficient can then be provided by the integrator:

$$c[n] = \mu \int_{i=0}^{n} e[i] \quad (12)$$

The input to the integrator can be multiplied by an additional constant $\mu$ defining the adaptation speed respectively the loop bandwidth. Next, the error value e[n] is low-pass filtered to a coefficient value $c[n-1] = \sim \sin(\phi)$. This coefficient is multiplied with the incoming Q branch sample stream. Finally, this product is subtracted from the I' branch samples. I'[n] contains phase imbalance I[n] values. The mathematical description of the IQ phase imbalance correction block is $$I'[n+1] - c[n]\cdot Q[n+1] = I[n+1] \quad (13)$$

Next, let us study an embodiment of the invention where frequency selective IQ phase imbalance adjustment is carried out. It is assumed that one or both of the analogue base band filters provide imperfections depending on their time domain impulse response respectively on their frequency transfer function. These imperfections could be one or more items, such as amplitude ripple, non-linear filter phase behaviour or filter ISI. Because of these imperfections, the above described non-frequency selective adjustment loop locks to a wrong error value. It is therefore necessary to implement an IQ phase imbalance error detector which is frequency selective and capable of covering analogue filter imperfection afflicted $\tilde{I}$ and $\tilde{Q}$ symbols. The following equation illustrates the mathematical operations:

$$e_i[n] = \tilde{I}[n-(N-1)/2]\cdot \tilde{Q}[n-(i-1)], i=1,2,\ldots,N \quad (14)$$

where N is an odd number and the index of the error value is valid from 1 to N. N is selected on the basis of the analogue filters. In practical cases in a WLAN environment, N typically has a value ranging from 7 to 19, but also other values may apply. The larger the value, the better the error value can be removed, at the cost of implementation difficulties.

Let us study a numerical example when N=5. In such a case equation (14) has the form $$e_i[n] = \tilde{I}[n-(5-1)/2]\cdot \tilde{Q}[n-(i-1)] = \tilde{I}[n-2]\cdot \tilde{Q}[n-(i-1)].$$

Error values can thus be defined as $$e_1[n] = \tilde{I}[n-2]\cdot \tilde{Q}[n]$$

$$e_2[n] = \tilde{I}[n-2]\cdot \tilde{Q}[n-1]$$

$$e_3[n] = \tilde{I}[n-2]\cdot \tilde{Q}[n-2]$$

$$e_4[n] = \tilde{I}[n-2]\cdot \tilde{Q}[n-3]$$

$$e_5[n] = \tilde{I}[n-2]\cdot \tilde{Q}[n-4]$$

Figure 5:
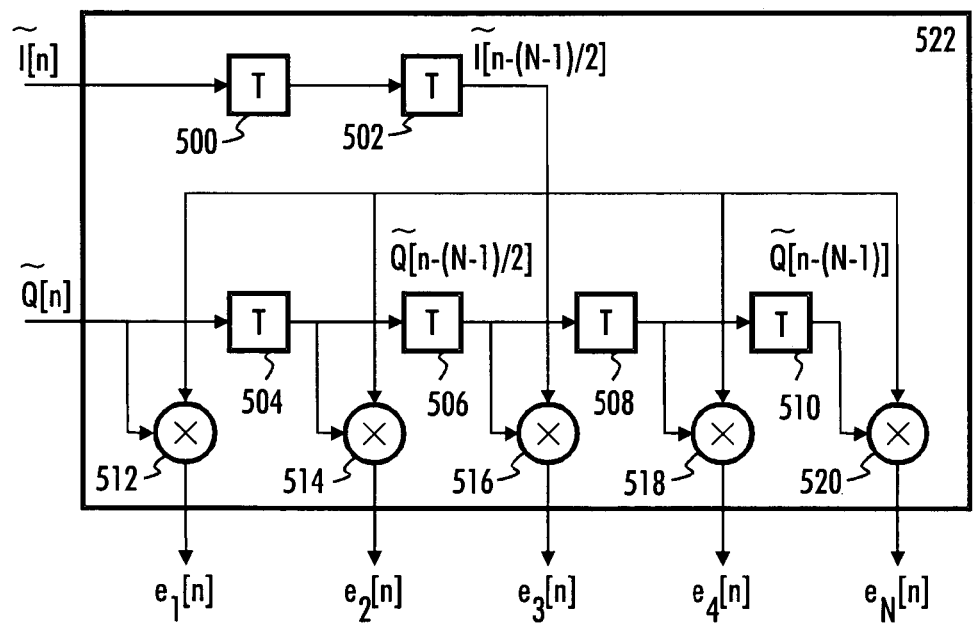
FIG. 5 illustrates an example of a frequency selective IQ error detector.

A possible implementation of the frequency selective IQ error detector disclosed above is illustrated in FIG. 5. The lengths of the tap delay lines are determined by N. The implementation is thus a tap delay line 522 with two delay elements 500, 502 in the I branch and four delay elements 504 to 510 in the Q branch. The centre tap (N−1)/2 of the I branch will be multiplied with N different values from the Q branch in multipliers 512 to 520.

Returning to the general case, each error value $e_i[n]$ is low-pass filtered by its own integrator:

$$c_i[n] = \mu \int_{k=0}^{0} e_i[k], i = 1, 2, \ldots, N \quad (15)$$

Figure 6:
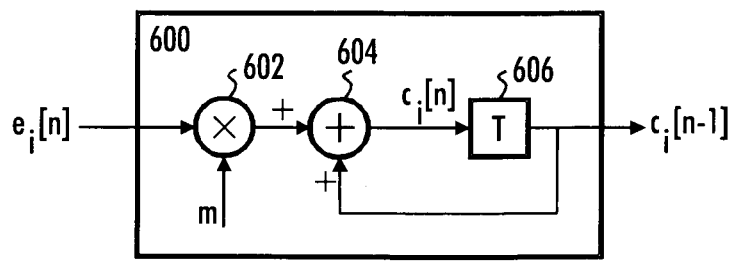
FIG. 6 illustrates an example of an integrator.

A possible implementation of one integrator is illustrated in FIG. 6. An integrator 600 comprises a multiplier 602, an adder 604 and a delay element 606, after which the signal is fed back to the adder 602.

The IQ imbalance correction can be performed according to the equation $$\tilde{I}[n-(N-1)/2] = \begin{bmatrix} \tilde{I}'[n(N-1)/2] - \\ \sum_{i=1}^{N} c_i[n-m]\cdot \tilde{Q}[n-(i-1)] \end{bmatrix}, \quad (16)$$

$$i = 1, 2, \ldots, N \text{ and } m > 0$$

Here, the variable m describes the implemented loop latency, which arises from the additional delay present in real implementation in hardware or digital signal processing software. A possible implementation is illustrated in FIG. 7A, assuming again that N=5. As in the error detector, in a tap delay line 726 the I branch comprises two delay elements 700, 702, and the Q branch four delay elements 704 to 710. As in the case of a channel equalizer, the Q branch values from the tap-delay line are multiplied by the corresponding correction coefficients $c_i$ in multipliers 712 to 720 and summed up in an adder 722. This result is subtracted from the imperfect I' branch centre tap in adder 724.

Figure 7A:
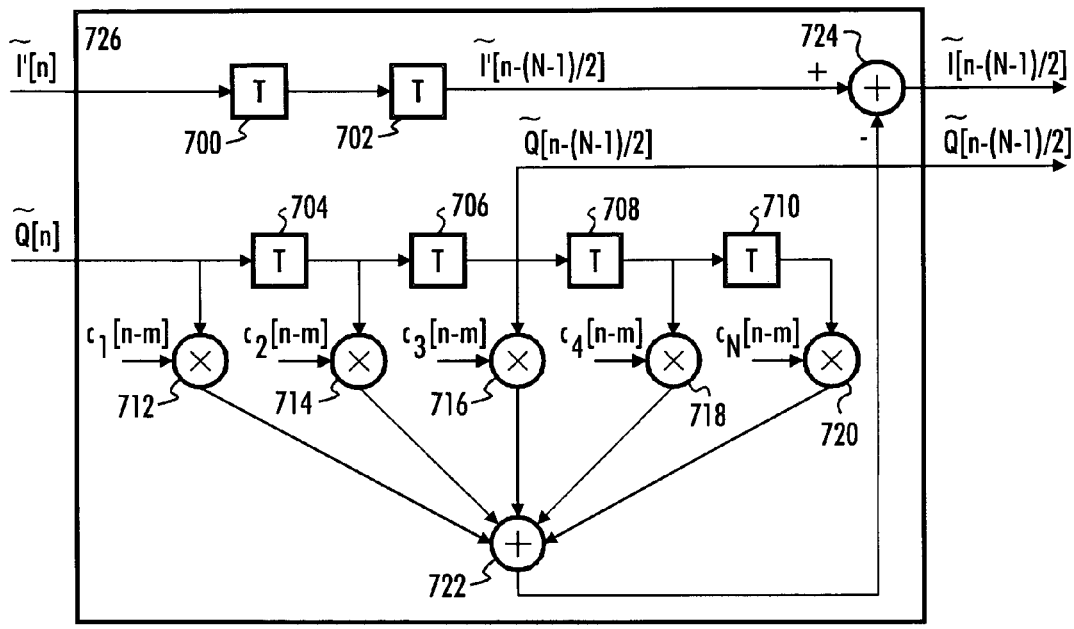
FIG. 7A illustrates an example of a frequency selective IQ error corrector.

Referring to the receiver of FIG. 3, the examples of the error detector and error correction blocks of FIGS. 5 and 7A belong to the phase imbalance adjustment block 318. The error correction and error detection blocks may be realized in a receiver using a software programmed processor, DSP (Digital Signal Processing) or discrete circuits.

Figure 7B:
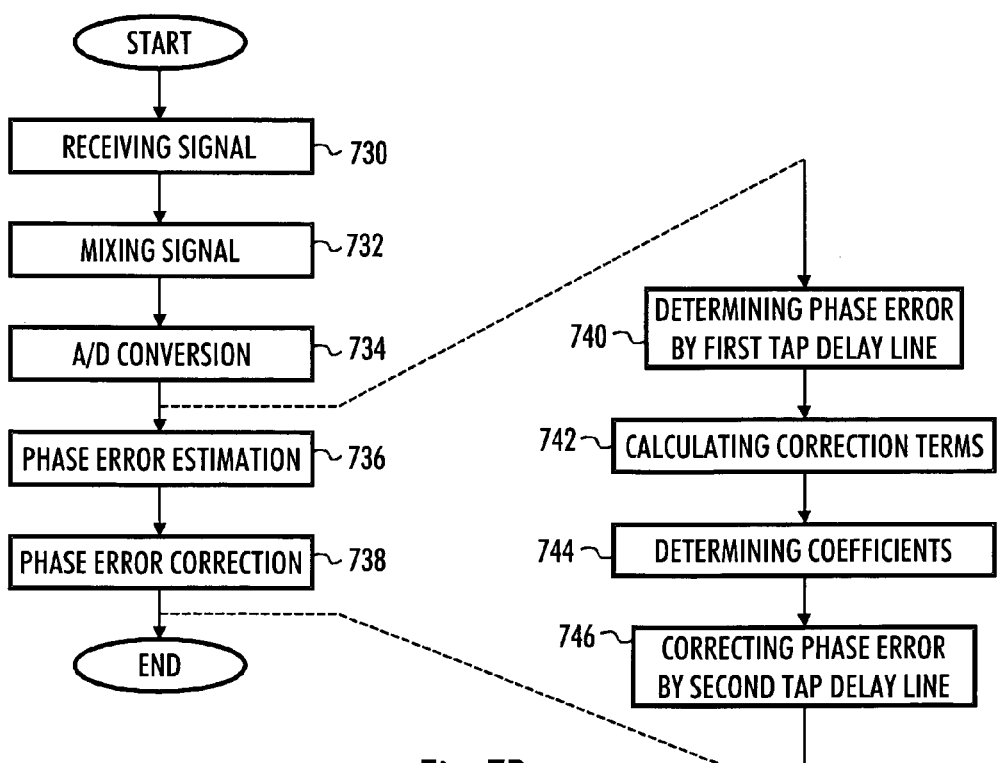
FIG. 7B illustrates a method according to an embodiment of the invention.

Referring to FIG. 7B, a method according to an embodiment of the invention thus comprises the following steps. In step 730, a radio frequency signal is received. In step 732, the received radio frequency signal is mixed into a base band signal comprising I and Q branches. In step 734, the base band signal is converted into digital form. In step 736, a frequency selective IQ phase error estimation is performed. In the next step 738, the digitised signal is corrected with frequency selective correction factors based on the error estimation.

In an embodiment of the invention, the steps 736 and 738 can be expressed in greater detail. From step 734, the method proceeds to step 740, where an IQ phase imbalance error is determined from the digitised signal with a first tap delay line. In the following step 742, correction terms are calculated on the basis of the determined error and in step 744, coefficients of a second tap delay line are determined on the basis of the correction terms. In step 746, the phase imbalance is corrected from the digitised signal with a second tap delay line.

Figure 8A:
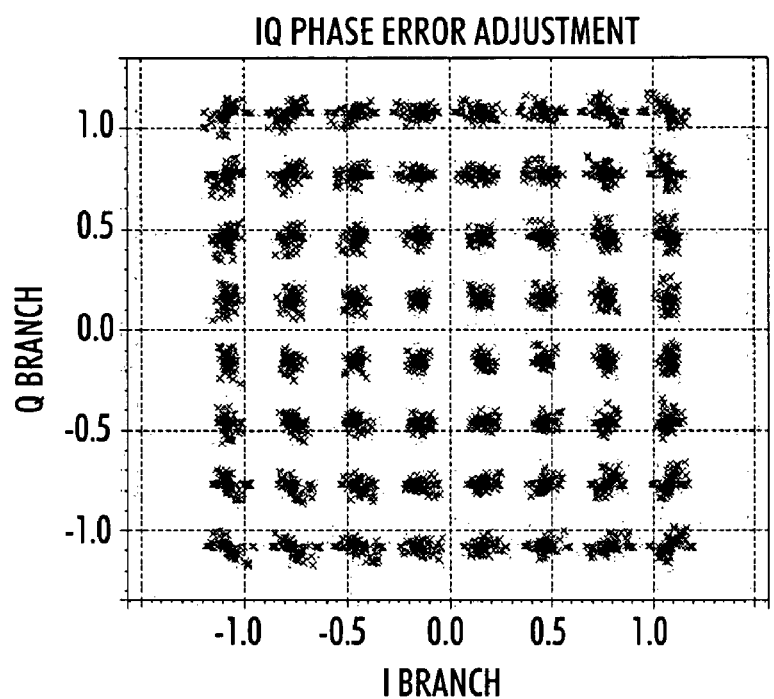
FIGS. 8A to 8C illustrate IQ diagrams in an ODFM environment.
Figure 8B:
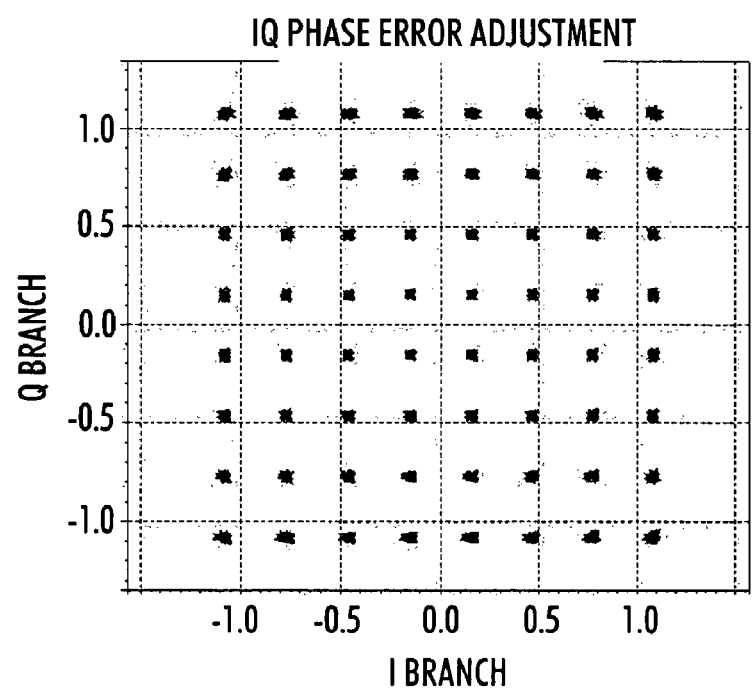
Figure 8C:
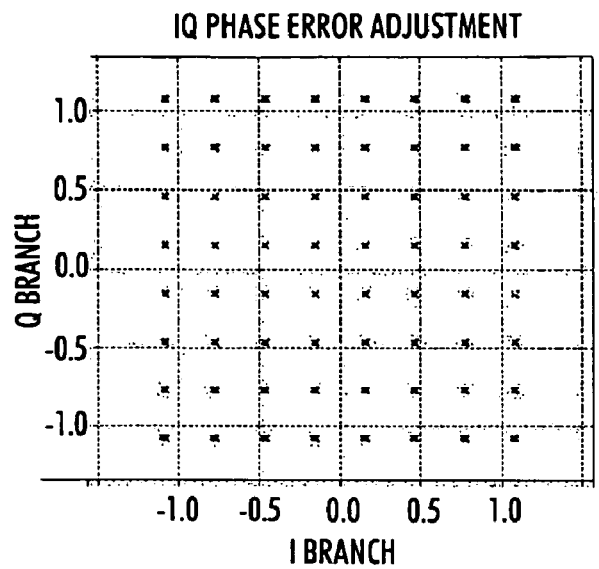

FIGS. 8A to 8C illustrate different IQ diagrams in an IEEE802.11a OFDM environment. Analogue low-pass filters insert imperfections in the IQ imbalance data stream. FIG. 8A shows the results of the non-frequency selective adjustment loop. As can be seen the adjustment is imperfect as the dots have spread considerably. FIGS. 8B and 8C present the adjustment carried out with 3-tap and 7-tap frequency selective adjustment loops, respectively. The 7-tap solution naturally performs better, due to a larger number of taps, but even the 3-tap solution is better than non-frequency selective adjustment.

Figure 9:
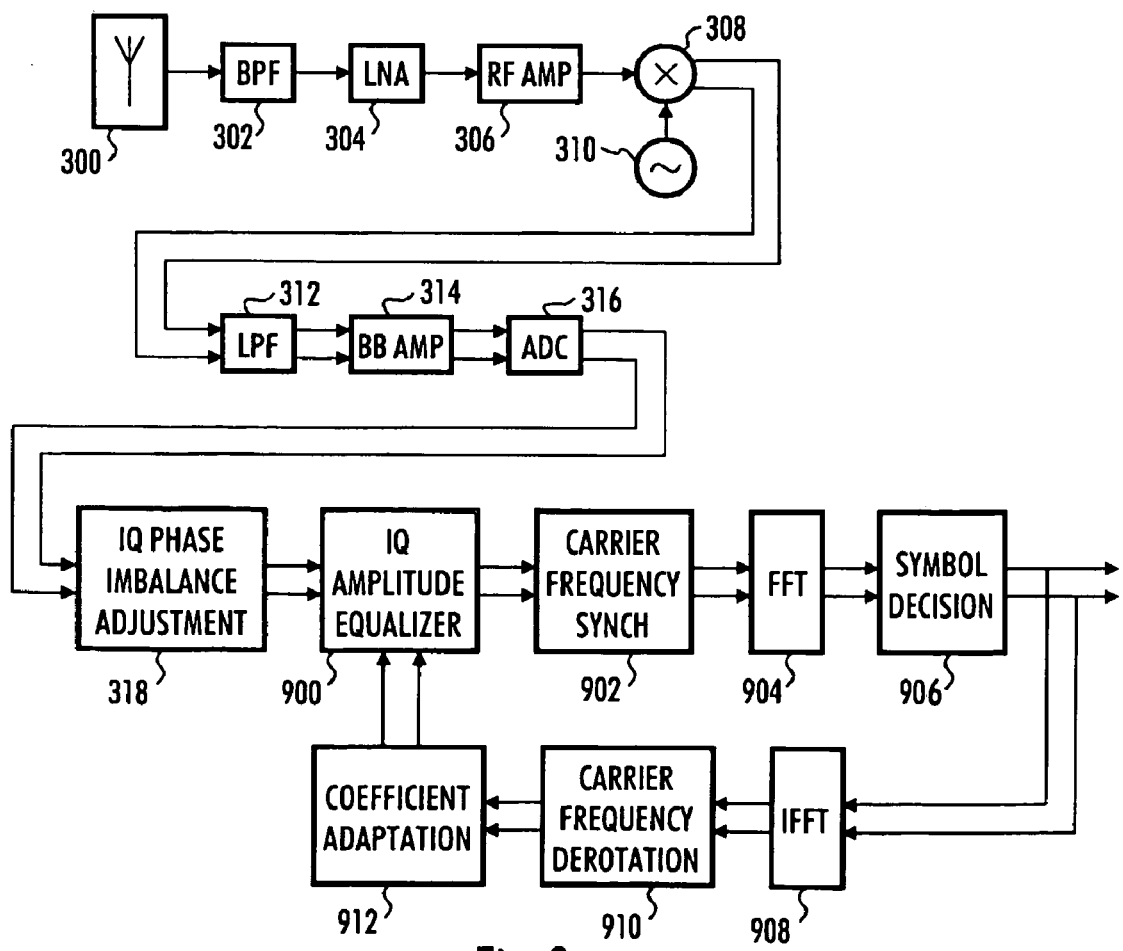
FIG. 9 illustrates an example of a direct conversion receiver.

Next, let us study an embodiment where also the IQ amplitude imbalance is corrected using a time domain filter with independent adaptive real coefficients. This can be applied to OFDM systems in particular. The amplitude imbalance adjustment may be carried out after the phase imbalance correction described above. The front end of a direct conversion OFDM receiver of this embodiment is illustrated in FIG. 9. The analogue parts and the A/D conversion are implemented as in the previous example. The operation of the IQ phase imbalance block 318 is described above. IQ amplitude imbalance adjustment block 900 is located after the phase imbalance adjustment block. Both algorithms operate in the receiver time domain and do not influence each other.

The IQ amplitude imbalance adjustment equalizer 900 can be realized with a time domain adaptive filter, which means that the filter coefficients can be modified from one clock sample to the next. Usually time domain channel equalizers, which are not necessary in OFDM systems but in single-carrier systems, do have complex filter coefficients. Their purpose is to remove channel imperfections. In this embodiment, however, the channel is not to be equalised but the analogue base band filters instead, and hence a time domain equalizer can be introduced to OFDM systems. One of the filters is in the analogue I branch, the other one being in the analogue Q branch. The filters are thus independent and they do not have complex filter coefficients but two independent digital adaptive filters with real coefficients.

The time domain adaptive filter can be considered as a conventional LMS (Least Mean Square) channel equalizer, but in this solution it does not use complex coefficients but two adaptive FIR filters with independent real coefficients.

The equalizer 900 is followed by carrier frequency synchronization block 902. An analogue receiver mixer usually has a slightly different carrier frequency than that of the analogue transmitter mixer. Therefore, between the transmitter and receiver there is a carrier frequency offset. The synchronization block is active in removing this rotation more or less completely. Next, the signal is converted to frequency domain using a FFT (Fast Fourier Transform) in block 904. The received IQ symbols are decoded to their original meaning in a decoder 906. If all decisions are correct, the output of the block generates exactly the same ideal symbols as the transmitter did before.

Because the LMS loop bandwidth is very small the equalizer does not recognize the channel changes. Hence it is possible to install an additional IFFT block and carrier frequency de-rotation via a software programmed processor or DSP. The ideal symbols are thus converted back to time domain using an IFFT (Inverse Fast Fourier Transform) in block 908. These symbols are now ideal fixed symbols. They are used to generate a synthetic training sequence. They thus have to be supplied to the time domain equalizer, which is still working in a rotating system. Therefore, the symbols must be rotated with the same offset, as was present in front of digital frequency synchronization block 902. This is performed in block 910. In coefficient adaptation block 912, a typical LMS equalizer coefficient calculation is performed. This is based on received and decoded IQ symbols. An error is calculated therefrom and the coefficients are updated. This procedure is performed in the same manner as in usual LMS equalisers, and so will not be described in detail herein.

Even though the invention has been described above with reference to an example according to the accompanying drawings, it is clear that the invention is not restricted thereto but can be modified in several ways within the scope of the appended claims.

The invention claimed is:

1. A method comprising:
receiving a radio frequency signal;
mixing the received radio frequency signal into a base band signal comprising I and Q branches;
converting the base band signal into digital form;
determining an IQ phase imbalance error from the digitized signal with a first tap delay line;
calculating correction terms based on the determined error;
correcting the phase imbalance of the digitized signal with a second tap delay line, whose coefficients are determined based on the correction terms; and
determining the first tap delay line according to the equation $$e_i[n] = \tilde{I}[n-(N-1)/2]\tilde{Q}[n-(i-1)], \text{ where } i=1,2,\ldots,N,$$
and $N$ is an odd integer, wherein e is error, and n is a sample number.

2. A method comprising:
receiving a radio frequency signal:
mixing the received radio frequency signal into a base band signal comprising I and Q branches;
converting the base band signal into digital form;
determining an IQ phase imbalance error from the digitized signal with a first tap delay line;
calculating correction terms based on the determined error;
correcting the phase imbalance of the digitized signal with a second tap delay line, whose coefficients are determined based on the correction terms; and
determining the second tap delay line according to the equation $$\tilde{I}[n(N-1)/2] = \begin{bmatrix} \tilde{I}'[n(N-1)/2] - \\ \sum_{i=1}^{N} c_i[n-m] \cdot \tilde{Q}[n-(i-1)] \end{bmatrix},$$

where $i=1,2,\ldots,N$, N is an odd integer and $m>0$, wherein n is a sample number, m is implemented loop latency, and c is correction.

3. An apparatus. comprising:
means for mixing a received signal into a base band signal comprising I and Q branches;
means for converting the base band signal into digital form;
a first tap delay line means for determining an IQ phase imbalance error of the digitized signal;
means for calculating correction terms based on the determined error; and a second tap delay line means for correcting the phase imbalance of digitized signal, coefficients of the second tap delay line means having been determined based on the correction terms, wherein the first tap delay line means is defined by the equation $e_i[n]=\tilde{I}[n-(N-1)/2]\tilde{Q}n-(i-1)]$, where $i=1,2,\ldots,N$, and $N$ is an odd integer, wherein e is error, and n is a sample number.

4. An apparatus, comprising:

means for mixing a received signal into a base band signal comprising I and Q branches;

means for converting the base band signal into digital form;

a first tap delay line means for determining an IQ phase imbalance error of the digitized signal;

means for calculating correction terms based on the determined error; and a second tap delay line means for correcting the phase imbalance of digitized signal, coefficients of the second tap delay line means having been determined based on the correction terms, wherein the second tap delay line means is defined by the equation $$\tilde{I}[n(N-1)/2] = \begin{bmatrix} \tilde{I}'[n(N-1)/2] - \\ \sum_{i=1}^{N} c_i[n-m]\cdot\tilde{Q}[n-(i-1)] \end{bmatrix},$$

where $i=1,2,\ldots,N$, $N$ is an odd integer and $m>0$, wherein n is a sample number, m is implemented loop latency, and c is correction.

5. An apparatus, comprising:

a mixer configured to mix a received signal into a base band signal comprising I and Q branches;

a converter configured to convert the base band signal into digitized signal;

an estimator configured to perform a frequency selective an IQ phase imbalance error estimation on the digitized signal with a first tap delay line;

an error corrector configured to calculate correction terms based on the determined error and correcting the chase imbalance of digitized signal with a second tap delay line, signal, coefficients of the second tap delay line means having been determined based on the correction terms;

a first tap delay line configured to determine an IQ phase imbalance error of the digitized signal;

a term calculator configured to calculate correction terms based on the determined error; and a second tap delay line configured to correct the phase imbalance of digitized signal, the coefficients of the second tap delay line having been determined based on the correction terms, wherein the first tap delay line is defined by the equation $e_i[n]=\tilde{I}[n-(N-1)/2]\tilde{Q}n-(i-1)]$, where $i=1,2,\ldots,N$, and $N$ is an odd integer, wherein e is error, and n is a sample number.

6. An apparatus, comprising:

a mixer configured to mix a received signal into a base band signal comprising I and Q branches;

a converter configured to convert the base band signal into digitized signal;

an estimator configured to perform a frequency selective an IQ phase imbalance error estimation on the digitized signal with a first tap delay line;

an error corrector configured to calculate correction terms based on the determined error and correcting the phase imbalance of digitized signal with a second tap delay line, coefficients of the second tap delay line means having been determined based on the correction terms;

a first tap delay line configured to determine an IQ phase imbalance error of the digitized signal;

a term calculator configured to calculate correction terms based on the determined error; and a second tap delay line configured to correct the phase imbalance of digitized signal, the coefficients of the second tap delay line having been determined based on the correction terms, wherein the second tap delay line is defined by the equation $$\tilde{I}[n(N-1)/2] = \begin{bmatrix} \tilde{I}'[n(N-1)/2] - \\ \sum_{i=1}^{N} c_i[n-m]\cdot\tilde{Q}[n-(i-1)] \end{bmatrix},$$

where $i=1,2,\ldots,N$, $N$ is an odd integer and $m>0$, wherein n is a sample number, m is implemented loon latency, and c is correction.

* * * * *